(12) United States Patent  (10) Patent No.: US 7,833,028 B1
Huang et al.                (45) Date of Patent:     Nov. 16, 2010

(54) WIRELESS RECEIVING AND TRANSMITTING DEVICE HAVING AN EXPOSED PROJECTION STRUCTURE FOR USER TO HOLD

(75) Inventors: Chung-er Huang, Taipei (TW); Ming-Tai Kuo, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 0 days.

(21) Appl. No.: 12/711,372

(22) Filed: Feb. 24, 2010

(51) Int. Cl.
   *H01R 13/44* (2006.01)
(52) U.S. Cl. ..................................... 439/131
(58) Field of Classification Search ............... 439/131, 439/130, 901
   See application file for complete search history.

(56) References Cited

U.S. PATENT DOCUMENTS 6,135,786 A * 10/2000 Johnson et al. ............ 439/76.1
7,661,967 B2 * 2/2010 Tang et al. ................. 439/131
2008/0160802 A1 * 7/2008 Ni et al. ..................... 439/131
2010/0022107 A1 * 1/2010 Hou et al. .................. 439/131

* cited by examiner

*Primary Examiner*—Phuong K Dinh
(74) *Attorney, Agent, or Firm*—Rosenberg, Klein & Lee

(57) ABSTRACT

A wireless receiving and transmitting device includes a casing unit, an antenna unit, a substrate unit, a projection unit and an electrical connector unit. The casing unit has a casing. The antenna unit has an antenna module fixed in the casing. The substrate unit has a circuit substrate movably disposed in the casing and electrically connected to the antenna module. The projection unit has a projection element positioned on one end of the circuit substrate. The projection element has a bottom portion selectively exposed outside the casing or hidden in the casing according to the move of the circuit substrate, and the projection element has a top portion always exposed outside the casing. The electrical connector unit has an electrical connector position on another end of the circuit substrate, and the electrical connector is selectively exposed outside the casing or hidden in the casing.

7 Claims, 6 Drawing Sheets

WIRELESS RECEIVING AND TRANSMITTING DEVICE HAVING AN EXPOSED PROJECTION STRUCTURE FOR USER TO HOLD

BACKGROUND OF THE INVENTION

1. Field of the Invention

The present invention relates to a wireless receiving and transmitting device, in particular, to a wireless receiving and transmitting device having an exposed projection structure for user to hold or clamp.

2. Description of Related Art

Referring to FIG. 1, when a digital TV receiver R of the related art is inserted into a notebook N, the digital TV receiver R has an antenna A for receiving digital TV signals. In addition, the digital TV signals need to be decoded via the digital TV receiver R in order to output digital TV programs from the digital TV receiver R into the notebook N to display. However, the antenna A of the related art is exposed outside the digital TV receiver R, so that it is difficult and inconvenient for user to receive the antenna A and carry the digital TV receiver R.

SUMMARY OF THE INVENTION

In view of the aforementioned issues, the present invention provides a wireless receiving and transmitting device having an exposed projection structure for user to hold or clamp. The present invention has a circuit substrate far away from an antenna module by a predetermined distance in order to make a predetermined space near the antenna module. Hence, the antenna module can generate good antenna efficiency and antenna pattern due to the predetermined space. In addition, the user can hold or clamp a projection element to electrically insert an electrical connector into a predetermined electronic device.

To achieve the above-mentioned objectives, the present invention provides a wireless receiving and transmitting device having an exposed projection structure for user to hold, including: a casing unit, an antenna unit, a substrate unit, a projection unit and an electrical connector unit. The casing unit has a casing. The antenna unit has an antenna module fixed in the casing. The substrate unit has a circuit substrate movably disposed in the casing and electrically connected to the antenna module. The projection unit has a projection element positioned on one end of the circuit substrate. The projection element has a bottom portion selectively exposed outside the casing or hidden in the casing according to the move of the circuit substrate, and the projection element has a top portion always exposed outside the casing. The electrical connector unit has an electrical connector position on another end of the circuit substrate, and the electrical connector is selectively exposed outside the casing or hidden in the casing.

Therefore, when the projection element is pushed towards the electrical connector, the bottom portion of the projection element is hidden in the casing and the circuit substrate far away from the antenna module by a predetermined distance in order to make a predetermined space near the antenna module and the electrical connector is exposed outside the casing; the user holds the exposed top portion of the projection element to electrically insert the electrical connector into a predetermined electronic device.

To achieve the above-mentioned objectives, the present invention provides a wireless receiving and transmitting device having an exposed projection structure for user to hold, including: a casing unit, a substrate unit, a projection unit, an antenna unit and an electrical connector unit. The casing unit has a casing. The substrate unit has a circuit substrate movably disposed in the casing and electrically connected to the antenna module. The projection unit has a projection element that is hollow and positioned on one end of the circuit substrate. The projection element has a bottom portion selectively exposed outside the casing or hidden in the casing according to the move of the circuit substrate, and the projection element has a top portion always exposed outside the casing. The antenna unit has an antenna module fixed in the projection element and electrically connected to the circuit substrate. The electrical connector unit has an electrical connector position on another end of the circuit substrate, and the electrical connector is selectively exposed outside the casing or hidden in the casing.

Therefore, when the projection element is pushed towards the electrical connector, the bottom portion of the projection element is hidden in the casing and the electrical connector is exposed outside the casing; the user holds the exposed top portion of the projection element to electrically insert the electrical connector into a predetermined electronic device.

To achieve the above-mentioned objectives, the present invention provides a wireless receiving and transmitting device having an exposed projection structure for user to hold, including: a casing unit, an antenna unit, a substrate unit, a projection unit and an electrical connector unit. The casing unit has a casing. The antenna unit has an antenna module fixed in the casing. The substrate unit has a circuit substrate movably disposed in the casing and electrically connected to the antenna module. The projection unit has at least two projection elements respectively positioned on a top surface and a bottom surface of the circuit substrate or two opposite lateral sides of the circuit substrate. The at least two projection elements are exposed outside the casing, and the circuit substrate is movable according to the move of the at least two projection elements. The electrical connector unit has an electrical connector position on one end of the circuit substrate, and the electrical connector is selectively exposed outside the casing or hidden in the casing.

Therefore, when the projection element is pushed towards the electrical connector, the circuit substrate far away from the antenna module by a predetermined distance in order to make a predetermined space near the antenna module and the electrical connector is exposed outside the casing; the user holds the exposed top portion of the projection element to electrically insert the electrical connector into a predetermined electronic device.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1:
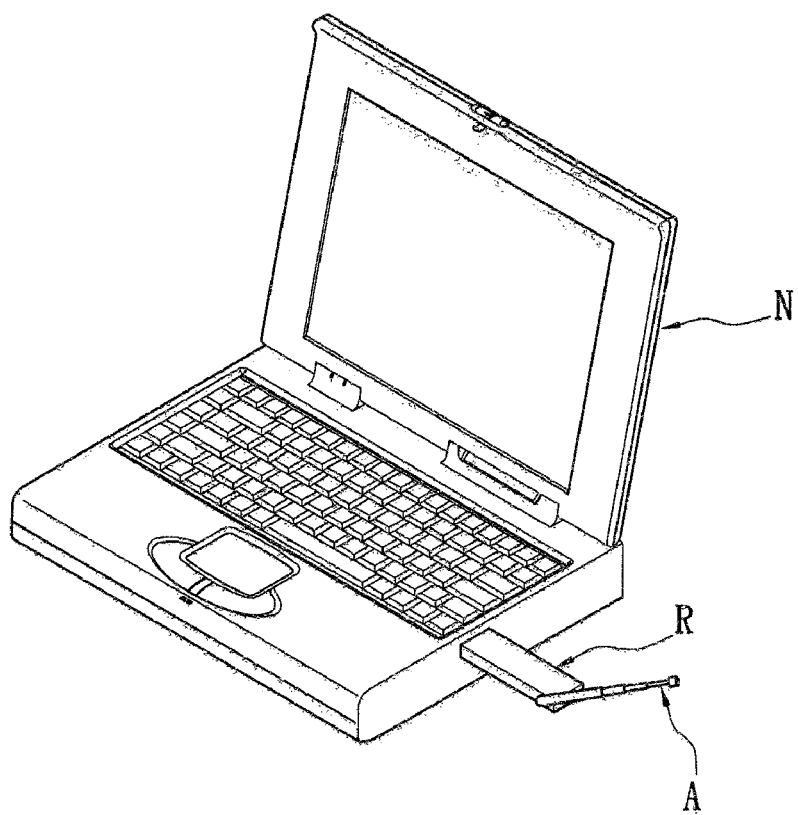
FIG. 1 is a perspective view of a conventional wireless receiving and transmitting device.

Referring to 2A to 2D, the first embodiment of the present invention provides a wireless receiving and transmitting device that has an exposed projection structure for user to hold. The wireless receiving and transmitting device includes a casing unit 1, an antenna unit 2, a substrate unit 3, a projection unit 4 and an electrical connector unit 5.

The casing unit 1 has a casing 10, at least one first opening 11 formed on one end of the casing 10 and at least one second opening 12 formed on another end of the casing 10. The casing unit 1 may be made of insulative material such as plastic. However, the above-mentioned design of the first opening 11 and the second opening 12 is just an example and that does not limit the present invention. For example, the design of any two openings passing through the casing 10 for respectively exposing the projection unit 4 and the electrical connector unit 5 is projected in the present invention.

Moreover, the antenna unit 2 has an antenna module 20 fixed in the casing 10 for receiving and transmitting signals. For example, the present invention may be applied to wireless transceiver, so that the antenna module 20 can be used to receive RF signals.

Furthermore, the substrate unit 3 has a circuit substrate 30 movably disposed in the casing 10 and electrically connected to the antenna module 10. In addition, the substrate unit 3 has a wireless signal receiving and transmitting module (not shown).

Figure 2A:
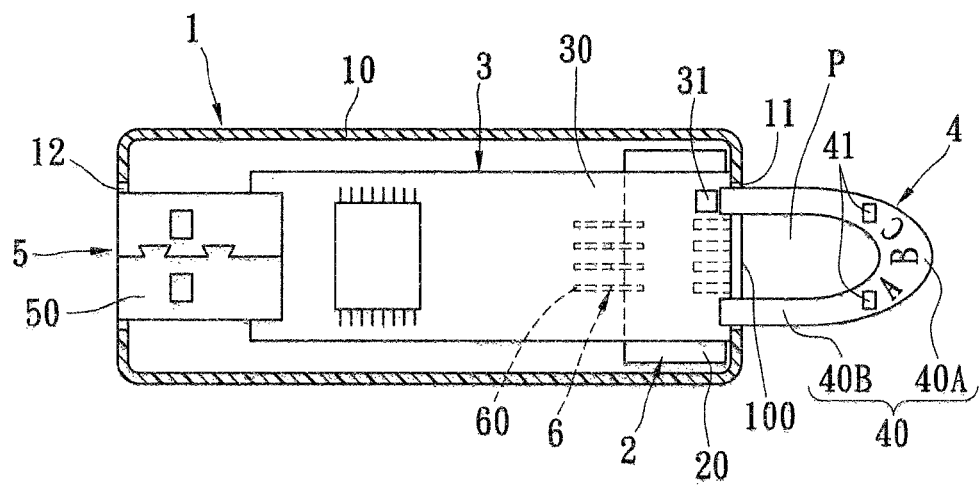
FIG. 2A is a top, cross-sectional, schematic view of the wireless receiving and transmitting device according to the first embodiment of the present invention (the electrical connector is closed)

Besides, the projection unit 4 has a projection element 40 positioned on one end of the circuit substrate 30. Any logotype with predetermined patterns, characters or numbers such as ABC shown on the projection element 40 in the FIG. 2A. The ABC is omitted in FIG. 2C. Moreover, the bottom portion 40B of the projection element 40 is selectively passing through the at least one first opening 11 as shown in FIGS. 2A and 2C. In other words, the projection element 40 has a bottom portion 40B selectively exposed outside the casing 10 (as shown in FIGS. 2A and 2B) or hidden in the casing 10 (as shown in FIGS. 2C and 2D) according to the move of the circuit substrate 30, and the projection element 40 has a top portion 40A always exposed outside the casing 10.

In addition, in the example of the first embodiment, the projection element 40 has a U shape, and two ends of the projection element 40 (two ends of the bottom portion 40B) are extended toward the same direction and positioned on the end of the circuit substrate 30. There is a through hole P formed between the projection element 40 and the casing 10, so that the user can use a rope to pass through the through hole P and hang on the user or on backpack. Hence, it is convenient for the user to carry and use the present invention.

Figure 2B:
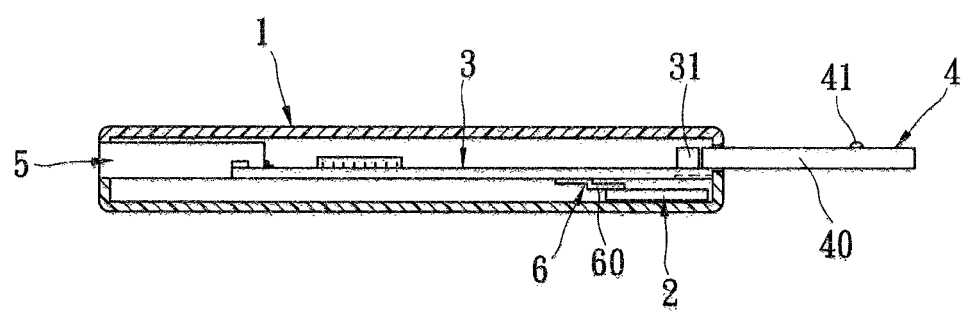
FIG. 2B is a lateral, cross-sectional, schematic view of the wireless receiving and transmitting device according to the first embodiment of the present invention (the electrical connector is closed)
Figure 2C:
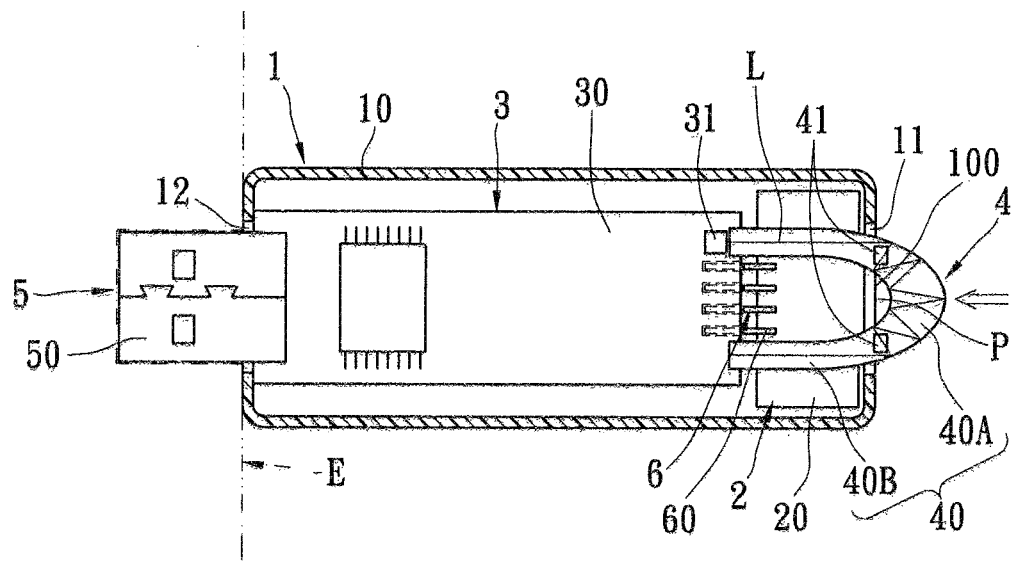
FIG. 2C is a top, cross-sectional, schematic view of the wireless receiving and transmitting device according to the first embodiment of the present invention (the electrical connector is opened)
Figure 2D:
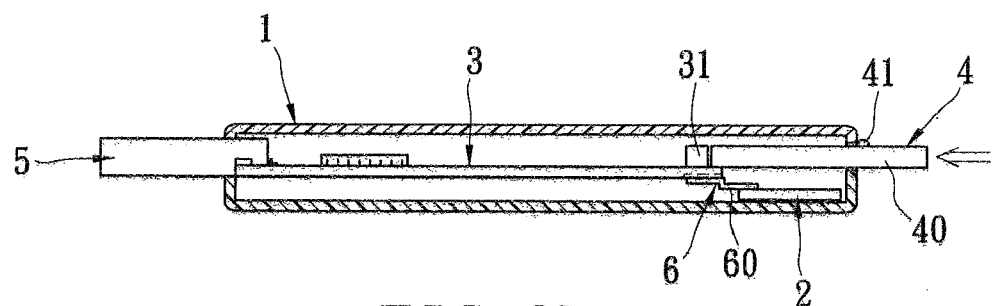
FIG. 2D is a lateral, cross-sectional, schematic view of the wireless receiving and transmitting device according to the first embodiment of the present invention (the electrical connector is opened)

Moreover, in the example of the first embodiment, the projection element 40 has two retaining bodies 41 disposed on an per surface thereof and selectively far away from (as shown in FIGS. 2A and 2B) or contacted (as shown in FIGS. 2C and 2D) a surface 100 of an end of the casing 10 in order to limit move distance of the projection element 40 towards the casing 10. The projection element 40 is divided into the top portion 40A and the bottom portion 40B by a division line from one retaining body 41 to another retaining body 41. In other words, when the two retaining bodies 41 contact the surface 100 of the casing 10, it means the projection element 40 has been pushed to the end and cannot be pushed any more. Hence, the two retaining bodies 41 can prevent the projection element 40 from being pushed excessively into the casing 10, so that the bottom portion 40B of the projection element 40 can be exposed completely outside the casing 10. The bottom portion 40B is a predetermined hold area for the user to hold or clamp the wireless receiving and transmitting device.

Furthermore, in the example of the first embodiment, the projection element 40 may be a solid light-guiding body. The substrate unit 3 has at least one light-emitting element 31 electrically disposed on the circuit substrate 30, so that the number of the light-emitting element 31 does not be limited. The light-emitting element 31 may be an LEI) (Light-Emitted Diode). In addition, referring to FIG. 2C, when the light beams L generated by the light-emitting element 31 are projecting onto the projection element (the light-guiding body) 40, the projection element (the light-guiding body) 40 is shown as a luminous body. Hence, the projection element 40 has a signal display function, for example when the projection element 40 is shown as a luminous body, it means that the wireless receiving and transmitting device of the present invention is receiving signals.

Besides, the electrical connector unit 5 has an electrical connector 50 position on another end of the circuit substrate 30, and the electrical connector 50 is selectively passing through the at least one second opening 12. In other words, the electrical connector 50 may be selectively exposed outside the casing 10 (as shown in FIGS. 2C and 2D) or hidden in the casing 10 (as shown in FIGS. 2A and 2B). In addition, in the example of the first embodiment, the electrical connector 50 may be a USB plug, an IEEE1394 plug or an RS232 plug. However, the above-mentioned definitions for the electrical connector 50 are just examples and do not limit the present invention, so that any type of electrical plug can be protected in the present invention.

Moreover, the wireless receiving and transmitting device further includes a conductive unit 6 having an electrical conductor 60 electrically connected between the circuit substrate 30 and the antenna module 20. The first embodiment provides many electrical conductors 60. The circuit substrate 30 is movably and electrically connected to one end of the electrical conductor 60, and the antenna module 20 is positioned on another end of the electrical conductor 60. In other words, the position of the antenna module 20 is fixed, and the circuit substrate 30 is movably and electrically connected to the antenna module 20 by the fixed electrical conductors 60.

Therefore, when the projection element 40 is pushed towards the electrical connector 50 (shown as the arrows in FIGS. 2C and 2D), three actions work at the same time, as follows: (1) the bottom portion 40B of the projection element 40 is hidden in the casing 10; (2) the circuit substrate 30 is far away from the antenna module 20 by a predetermined distance (the circuit substrate 30 and the antenna module 20 are fully or partially separated from each other) in order to make a predetermined space near the antenna module 20 (Hence, the antenna module 20 can generate good antenna efficiency and antenna pattern due to the predetermined space); and (3) the electrical connector 50 is exposed outside the casing 10. Hence, the user holds the exposed top portion (holding area or clamping area) 40A of the projection element 40 to electrically insert the electrical connector 50 into a predetermined electronic device E.

Figure 3A:
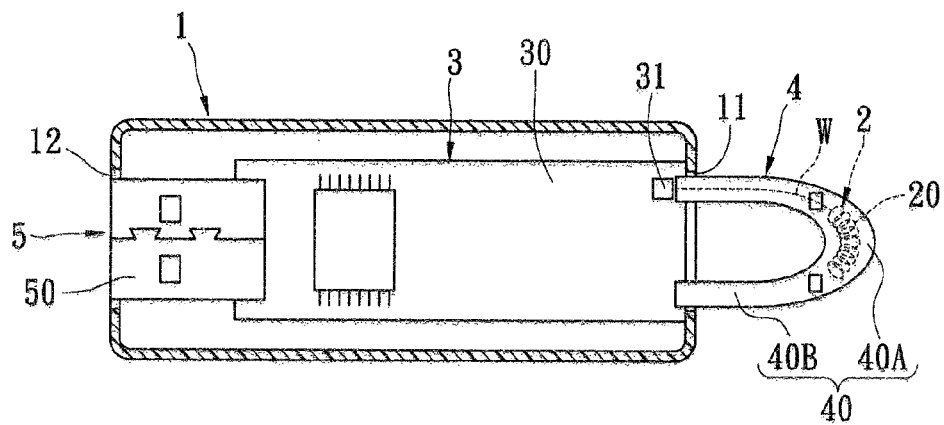
FIG. 3A is a top, cross-sectional, schematic view of the wireless receiving and transmitting device according to the second embodiment of the present invention (the electrical connector is closed)
Figure 3B:
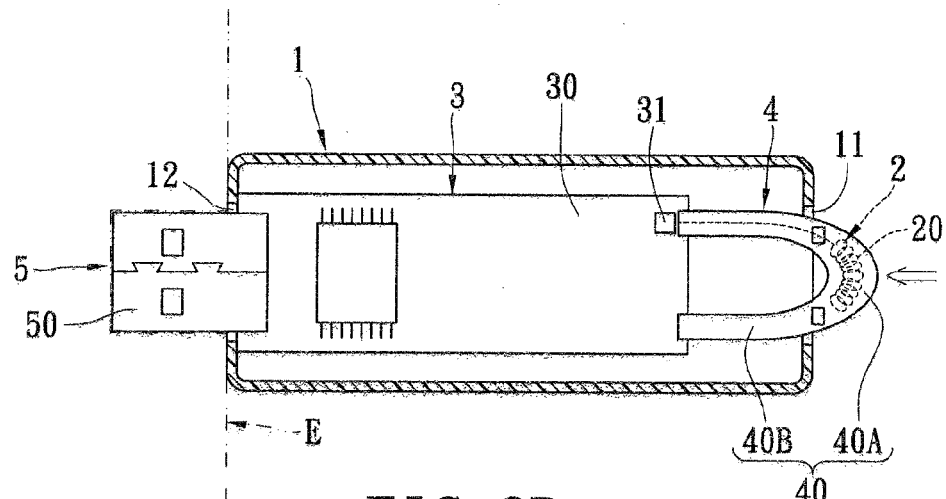
FIG. 3B is a top, cross-sectional, schematic view of the wireless receiving and transmitting device according to the second embodiment of the present invention (the electrical connector is opened)

Referring to FIGS. 3A and 3B, the second embodiment of the present invention provides a wireless receiving and transmitting device that has an exposed projection structure for user to hold. The wireless receiving and transmitting device includes a casing unit 1, an antenna unit 2, a substrate unit 3, a projection unit 4 and an electrical connector unit 5. The difference between the second embodiment and the first embodiment is that: in the second embodiment, the projection unit 4 has a projection element 40 that is hollow and positioned on one end of the circuit substrate 30, and the antenna unit 2 has an antenna module 20 fixed in the projection element 40 and electrically connected to the circuit substrate 30 by a conductive wire W. The circuit substrate 30 is far away from the antenna module 20 by a predetermined distance, so that the antenna module 20 can generate good antenna efficiency and antenna pattern.

Therefore, when the projection element 40 is pushed towards the electrical connector 50 (shown as the arrows in FIG. 3B), two actions work at the same time, as follows: (1) the bottom portion 4013 of the projection element 40 is hidden in the casing 10 and (2) the electrical connector 50 is exposed outside the casing 10. Hence, the user holds the exposed top portion (holding area or clamping area) 40A of the projection element 40 to electrically insert the electrical connector 50 into a predetermined electronic device E.

Figure 4A:
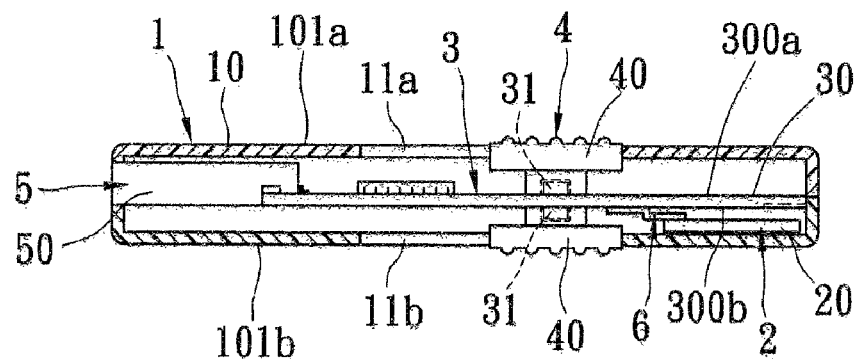
FIG. 4A is a lateral, cross-sectional, schematic view of the wireless receiving and transmitting device according to the third embodiment of the present invention (the electrical connector is closed)
Figure 4B:
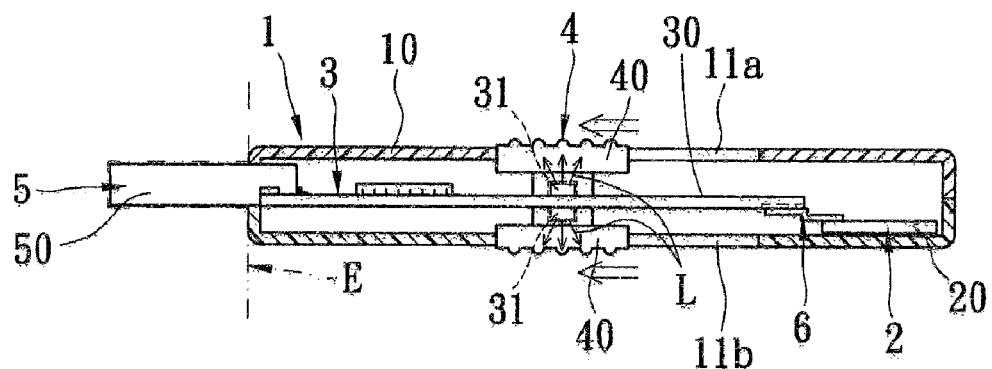
FIG. 4B is a lateral, cross-sectional, schematic view of the wireless receiving and transmitting device according to the third embodiment of the present invention (the electrical connector is opened)

Referring to FIGS. 4A and 4B, the third embodiment of the present invention provides a wireless receiving and transmitting device that has an exposed projection structure for user to hold. The wireless receiving and transmitting device includes a casing unit 1, an antenna unit 2, a substrate unit 3, a projection unit 4, an electrical connector unit 5 and a conductive unit 6. The difference between the third embodiment and the first embodiment is that: in the third embodiment, the projection unit 4 has at least two symmetrical projection elements 40 respectively positioned on a top surface 300a and a bottom surface 300b of the circuit substrate 30. The at least two projection elements 40 are exposed outside the casing 10, and the circuit substrate 30 is movable according to the move of the at least two projection elements 40. In other words, the casing unit 1 has at least two first openings (11a, 11b) respectively formed on a top surface 101a and a bottom surface 101b of the casing 10, and the at least two projection elements 40 respectively pass through the at least two first openings (11a, 11b) to be exposed outside the casing 10.

Moreover, the at least two projection elements 40 are respectively moved in the at least two first openings (11a, 11b) in order to limit move distance of the at least two projection elements 40. Furthermore, each of the projection elements 40 may be solid light-guiding body. The substrate unit 3 has at least two light-emitting elements 31 electrically disposed on the circuit substrate 30, so that the number of the light-emitting element 31 does not be limited. The light-emitting element 31 may be an LED (Light-Emitted Diode). In addition, referring to FIG. 2C, when the light beams L generated by the two light-emitting elements 31 are respectively projecting onto the two projection elements (the light-guiding body) 40, each of the two projection elements (the two light-guiding bodies) 40 is shown as luminous body. Hence, each of the projection elements 40 has a signal display function, for example when the two projection elements 40 are shown as luminous bodies, it means that the wireless receiving and transmitting device of the present invention is receiving signals. Of course, the two projection elements 40 may be integrated with each other to form one piece, so that the present invention can use only one light-emitting element 31 to generate light beams that are projected onto one of the two projection elements 40 in order to show usage state of the wireless receiving and transmitting device.

Therefore, when the two projection elements 40 are pushed towards the electrical connector 50 (shown as the arrows in FIG. 4B), two actions work at the same time, as follows: (1) the circuit substrate 30 is far away from the antenna module 20 by a predetermined distance (the circuit substrate 30 and the antenna module 20 are fully or partially separated from each other) in order to make a predetermined space near the antenna module 20 (Hence, the antenna module 20 can generate good antenna efficiency and antenna pattern due to the predetermined space); and (3) the electrical connector 50 is exposed outside the casing 10. Hence, the user can respectively use thumb and forefinger to hold or clamp the two projection elements 40 in order to electrically insert the electrical connector 50 into a predetermined electronic device E.

Figure 5A:
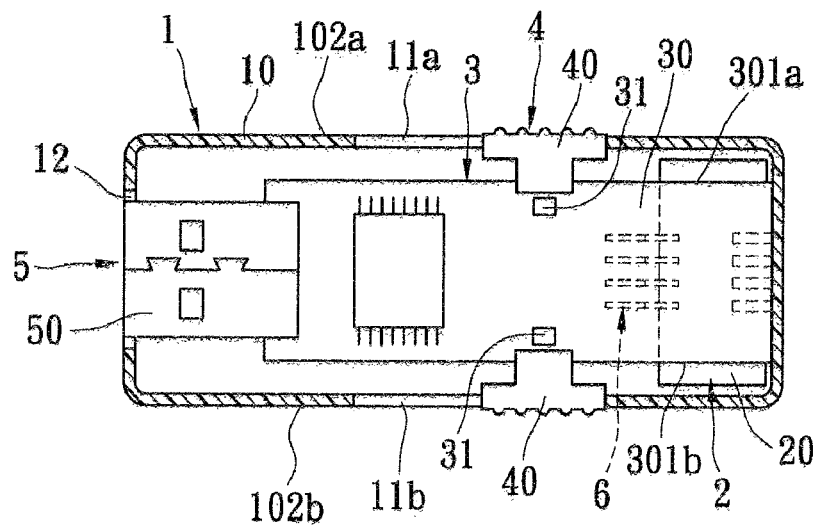
FIG. 5A is a top, cross-sectional, schematic view of the wireless receiving and transmitting device according to the tburth embodiment of the present invention (the electrical connector is closed)
Figure 5B:
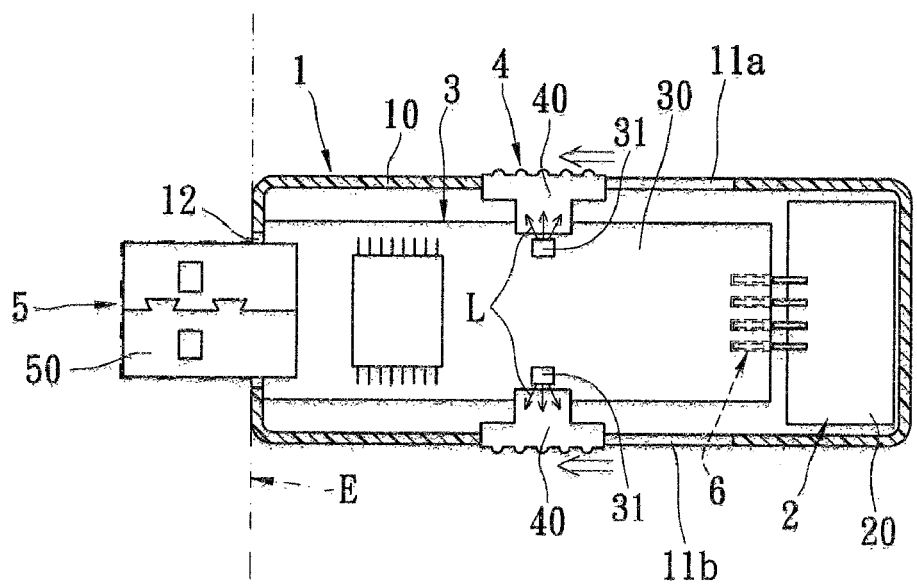
FIG. 5B is a top, cross-sectional, schematic view of the wireless receiving and transmitting device according to the fourth embodiment of the present invention (the electrical connector is opened).

Referring to FIGS. 5A and 5B, the fourth embodiment of the present invention provides a wireless receiving and transmitting device that has an exposed projection structure for user to hold. The wireless receiving and transmitting device includes a casing unit 1, an antenna unit 2, a substrate unit 3, a projection unit 4, an electrical connector unit 5 and a conductive unit 6. The difference between the fourth embodiment and the third embodiment is that: in the fourth embodiment, the projection unit 4 has at least two symmetrical projection elements 40 respectively positioned on two opposite lateral sides (310a, 301b) of the circuit substrate 30. The at least two projection elements 40 are exposed outside the casing 10, and the circuit substrate 30 is movable according to the move of the at least two projection elements 40. In other words, the casing unit 1 has at least two first openings (11a, 11b) respectively formed on a top surface 102a and a bottom surface 102b of the casing 10, and the at least two projection elements 40 respectively pass through the at least two first openings (11a, 11b) to be exposed outside the casing 10. Of course, the two projection elements 40 may be integrated with each other to form one piece, so that the present invention can use only one light-emitting element 31 to generate light beams that are projected onto one of the two projection elements 40 in order to show usage state of the wireless receiving and transmitting device.

Therefore, when the two projection elements 40 are pushed towards the electrical connector 50 (shown as the arrows in FIG. 4B), two actions work at the same time, as follows: (1) the circuit substrate 30 is far away from the antenna module 20 by a predetermined distance (the circuit substrate 30 and the antenna module 20 are fully or partially separated from each other) in order to make a predetermined space near the antenna module 20 (Hence, the antenna module 20 can generate good antenna efficiency and antenna pattern due to the predetermined space); and (3) the electrical connector 50 is exposed outside the casing 10. Hence, the user can respectively use thumb and forefinger to hold or clamp the two projection elements 40 in order to electrically insert the electrical connector 50 into a predetermined electronic device E.

In addition, in the third embodiment as shown in FIGS. 4A and 413 and the fourth embodiment as shown in FIGS. 5A and 5B, the user can simultaneously use thumb and forefinger to hold or clamp the two projection elements 40 in order to electrically insert the electrical connector 50 into a predetermined electronic device E. However, in the related art, only the user uses complex tenon to fix an electrical connector, the electrical connector just can be electrically insert into a predetermined electronic device E. Hence, the wireless receiving and transmitting device does not need to use the complex tenon, so that the present invention can solve the problem of using the complex tenon.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. A wireless receiving and transmitting device having an exposed projection structure for user to hold, comprising:
   a casing unit having a casing;
   an antenna unit having an antenna module fixed in the casing;
   a substrate unit having a circuit substrate movably disposed in the casing and electrically connected to the antenna module;
   a projection unit having a projection element positioned on one end of the circuit substrate, wherein the projection element has a bottom portion selectively exposed outside the casing or hidden in the casing according to the move of the circuit substrate, and the projection element has a top portion always exposed outside the casing; and
   an electrical connector unit having an electrical connector position on another end of the circuit substrate, wherein the electrical connector is selectively exposed outside the casing or hidden in the casing;
   whereby, when the projection element is pushed towards the electrical connector, the bottom portion of the projection element is hidden in the casing and the circuit substrate far away from the antenna module by a predetermined distance in order to make a predetermined space near the antenna module and the electrical connector is exposed outside the casing; the user holds the exposed top portion of the projection element to electrically insert the electrical connector into a predetermined electronic device.

2. The wireless receiving and transmitting device according to claim 1, further comprising; a conductive unit having an electrical conductor electrically connected between the circuit substrate and the antenna module, wherein the circuit substrate is movably and electrically connected to one end of the electrical conductor, and the antenna module is positioned on another end of the electrical conductor.

3. The wireless receiving and transmitting device according to claim 1, wherein the casing unit has at least one first opening formed on one end of the casing and at least one second opening formed on another end of the casing, the bottom portion of the projection element is selectively passing through the at least one first opening, and the electrical connector is selectively passing through the at least one second opening.

4. The wireless receiving and transmitting device according to claim 1, wherein the projection element is a light-guiding body, the substrate unit has at least one light-emitting element electrically disposed on the circuit substrate, and light beams generated by the at least one light-emitting element are projected onto the light-guiding body.

5. The wireless receiving and transmitting device according to claim 1, wherein the projection element has a U shape, and two ends of the projection element are extended toward the same direction and positioned on the end of the circuit substrate.

6. The wireless receiving and transmitting device according to claim 1, wherein the projection element has at least one retaining body disposed on an outer surface thereof and selectively far away from or contacted a surface of an end of the casing in order to limit move distance of the projection element towards the casing.

7. The wireless receiving and transmitting device according to claim 1, wherein the electrical connector is a USB plug, an IEEE 1394 plug or an RS232 plug.

* * * * *